US009166599B1

(12) United States Patent
Hutton

(10) Patent No.: US 9,166,599 B1
(45) Date of Patent: *Oct. 20, 2015

(54) METHODS AND APPARATUS FOR BUILDING BUS INTERCONNECTION NETWORKS USING PROGRAMMABLE INTERCONNECTION RESOURCES

(71) Applicant: Altera Corporation, San Jose, CA (US)

(72) Inventor: Michael D. Hutton, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/212,667

(22) Filed: Mar. 14, 2014

Related U.S. Application Data

(63) Continuation of application No. 13/656,262, filed on Oct. 19, 2012, now Pat. No. 8,704,548.

(51) Int. Cl.
*H03K 19/177* (2006.01)

(52) U.S. Cl.
CPC ............................ *H03K 19/17744* (2013.01)

(58) Field of Classification Search
CPC .................. H03K 19/17736; H03K 19/177
USPC ............................................. 326/37–41, 46
See application file for complete search history.

(56) References Cited

U.S. PATENT DOCUMENTS

| | | | |
|---|---|---|---|
| 4,758,745 A | 7/1988 | Elgamal et al. | |
| 5,424,589 A | 6/1995 | Dobbelaere et al. | |
| 5,594,367 A | 1/1997 | Trimberger et al. | |
| 7,072,345 B2 | 7/2006 | Siu et al. | |
| 7,944,236 B2 | 5/2011 | How et al. | |
| 2001/0006347 A1 | 7/2001 | Jefferson et al. | |
| 2003/0128051 A1 | 7/2003 | Cliff et al. | |
| 2006/0006904 A1* | 1/2006 | Marui | 326/38 |
| 2006/0232296 A1 | 10/2006 | Wang et al. | |
| 2010/0283505 A1 | 11/2010 | Koch et al. | |
| 2012/0126851 A1 | 5/2012 | Kelem et al. | |
| 2014/0021981 A1 | 1/2014 | Hutton | |

FOREIGN PATENT DOCUMENTS

GB 2312067 10/1997

* cited by examiner

*Primary Examiner* — Don Le
(74) *Attorney, Agent, or Firm* — Jason Tsai

(57) ABSTRACT

Integrated circuits may include logic regions configurable to perform custom functions. Interconnects may be used to rout signals throughout the integrated circuit. The logic region may be coupled to input selection circuitry for selecting and providing input signals from the interconnects to the logic regions and to output selection and routing circuitry for selecting and transmitting output signals over interconnects to other logic regions. Bypass circuitry may provide direct access to registers inside the logic regions and to the output selection and routing circuitry by bypassing the input selection circuitry and other processing circuitry inside the logic regions. Bus interconnections having logic regions performing register pipelining, wire stitching, and acting as data source/sink stations to get on and off the bus interconnections may be generated by configuring the bypass circuitry and the output selection and routing circuitry appropriately.

20 Claims, 11 Drawing Sheets

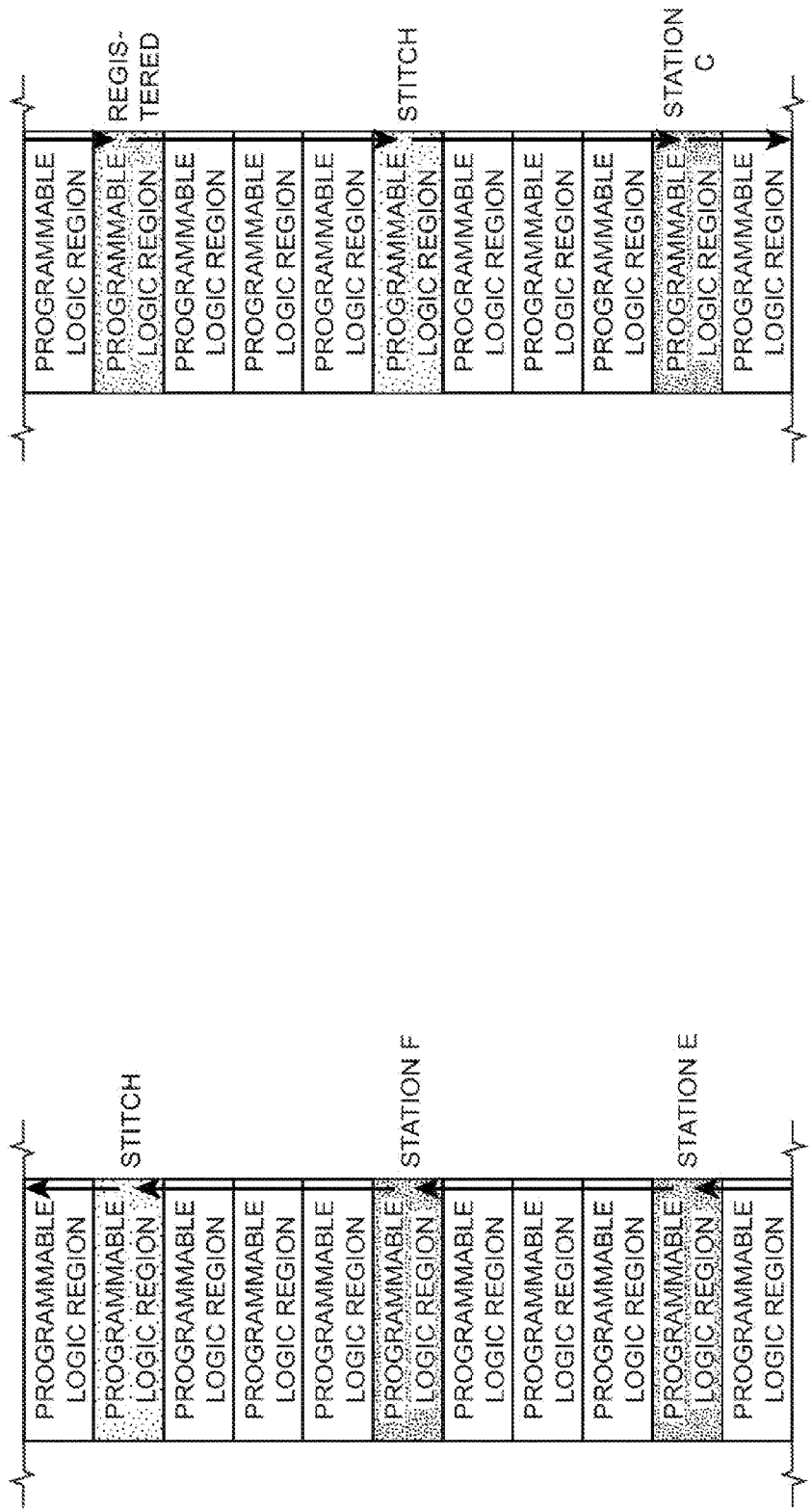
FIG. 6 (Cont. 1)

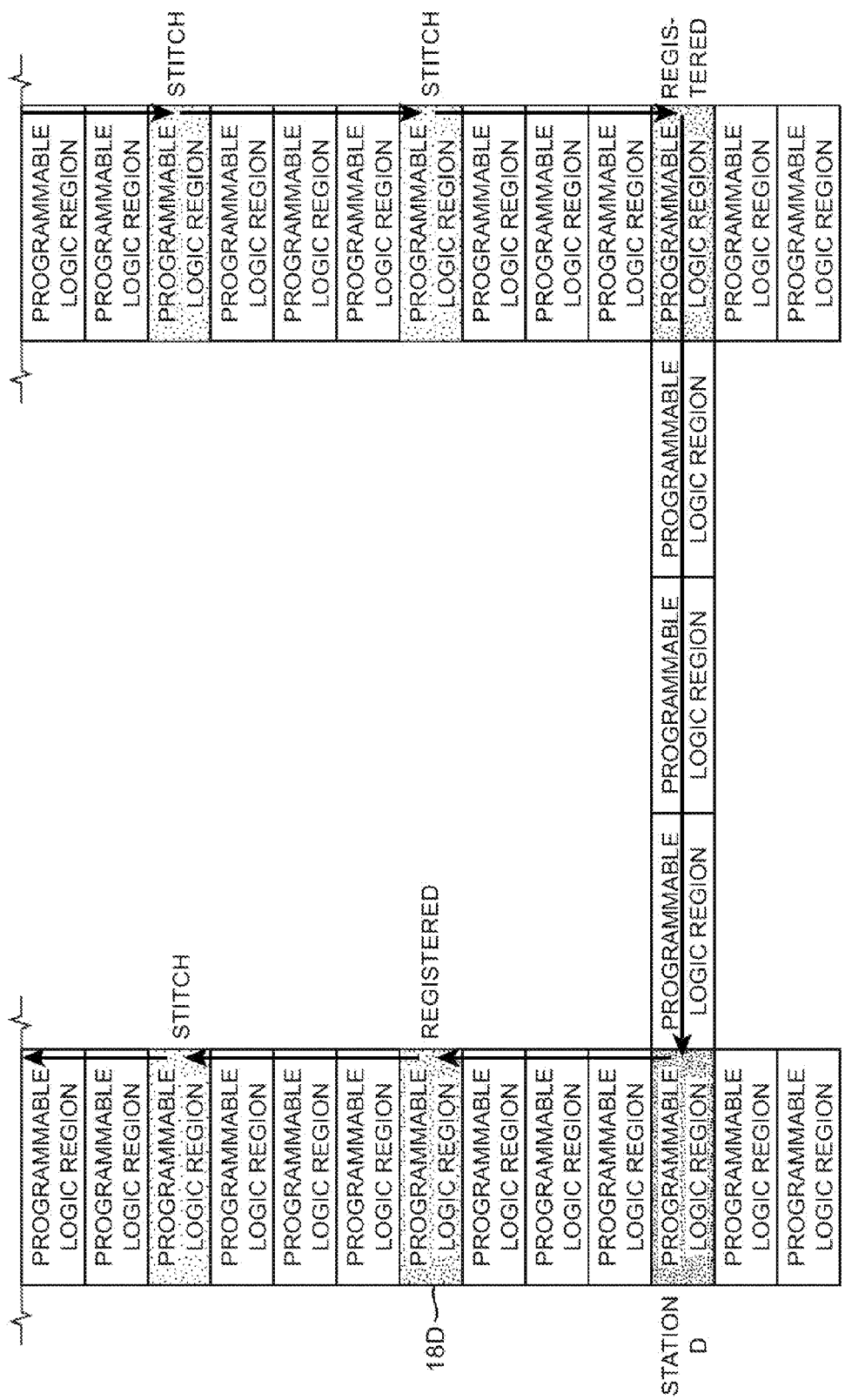
FIG. 6 (Cont. 2)

METHODS AND APPARATUS FOR BUILDING BUS INTERCONNECTION NETWORKS USING PROGRAMMABLE INTERCONNECTION RESOURCES

This application claims the benefit of and claims priority to U.S. patent application Ser. No. 13/656,262, filed Oct. 19, 2012, which is hereby incorporated by reference herein in its entirety.

BACKGROUND

This invention relates to integrated circuits such as programmable integrated circuits with interconnect circuitry.

Programmable integrated circuits can be programmed by a user to implement a desired custom logic function. In a typical scenario, a logic designer uses computer-aided design (CAD) tools to design a custom logic circuit. When the design process is complete, the tools generate configuration data. The configuration data is loaded into programmable integrated circuit memory elements to configure the device to perform the functions of the custom logic circuit. In particular, the configuration data configures programmable interconnects, programmable routing circuits, and programmable logic circuits in the programmable integrated circuits.

Programmable integrated circuits may include programmable logic circuits that are configured to receive input signals and perform custom functions to produce output signals. The input and output signals of each logic circuit are routed by interconnects that can be configured to route selected signals throughout the programmable integrated circuit.

Interconnects in conventional programmable circuits are typically provided as point-to-point connections. Point-to-point connections do not handle long wide connections such as bus interconnections very efficiently, resulting in routing congestion and timing closure problems and thereby increasing development time.

SUMMARY

In accordance with some embodiments of the present invention, an integrated circuit may include logic regions and global interconnects that are used to route signals throughout the integrated circuit. Each logic region may be coupled to input selection circuitry and output selection routing circuitry. The input selection circuitry is coupled to a corresponding set of interconnects. The input selection circuitry may be configured to provide selected signals from the set of interconnects to inputs of the corresponding logic region. The logic region may be configured to perform custom functions to produce output signals from the selected signals. For example, the logic region may include processing circuitry that receives the selected signals and that is configured to produce the output signals.

A logic region may include one or more registers. The registers may store information such as output signals produced by the processing circuitry of that logic region. The output signals of the registers and the output signals of the processing circuitry may be sent to the output selection and rotating circuitry.

The output selection and routing circuitry may be configured to select output signals from the registers and from the processing circuitry and provide the selected output signals to output drivers that may drive interconnects (e.g., global interconnects). For example, the output circuitry may include one or more multiplexers and a driver coupled to each interconnect.

Logic regions may include bypass paths for directly accessing the registers and the output selection and routing circuitry (e.g., to bypass the input selection circuitry and processing circuitry).

It is appreciated that the present invention can be implemented in numerous ways, such as a process, an apparatus, a system, a device, or a method on a computer readable medium. Several embodiments of the present invention are described below.

In certain embodiments, the above mentioned bypass paths may include bypass paths having bypass circuitry that is coupled to a subset of the interconnect and that selects a signal from this subset for bypassing the input selection circuitry. The selected signal is then directly routed to the register in the logic region and to the output selection and routing circuitry.

Further features of the invention, its nature and various advantages, will be more apparent from the accompanying drawings and the following detailed description of the preferred embodiments.

DETAILED DESCRIPTION

The present invention relates to integrated circuits and more specifically to programmable integrated circuits. The programmable integrated circuits may include programmable logic, programmable interconnects, and programmable routing circuitry.

Figure 1A:
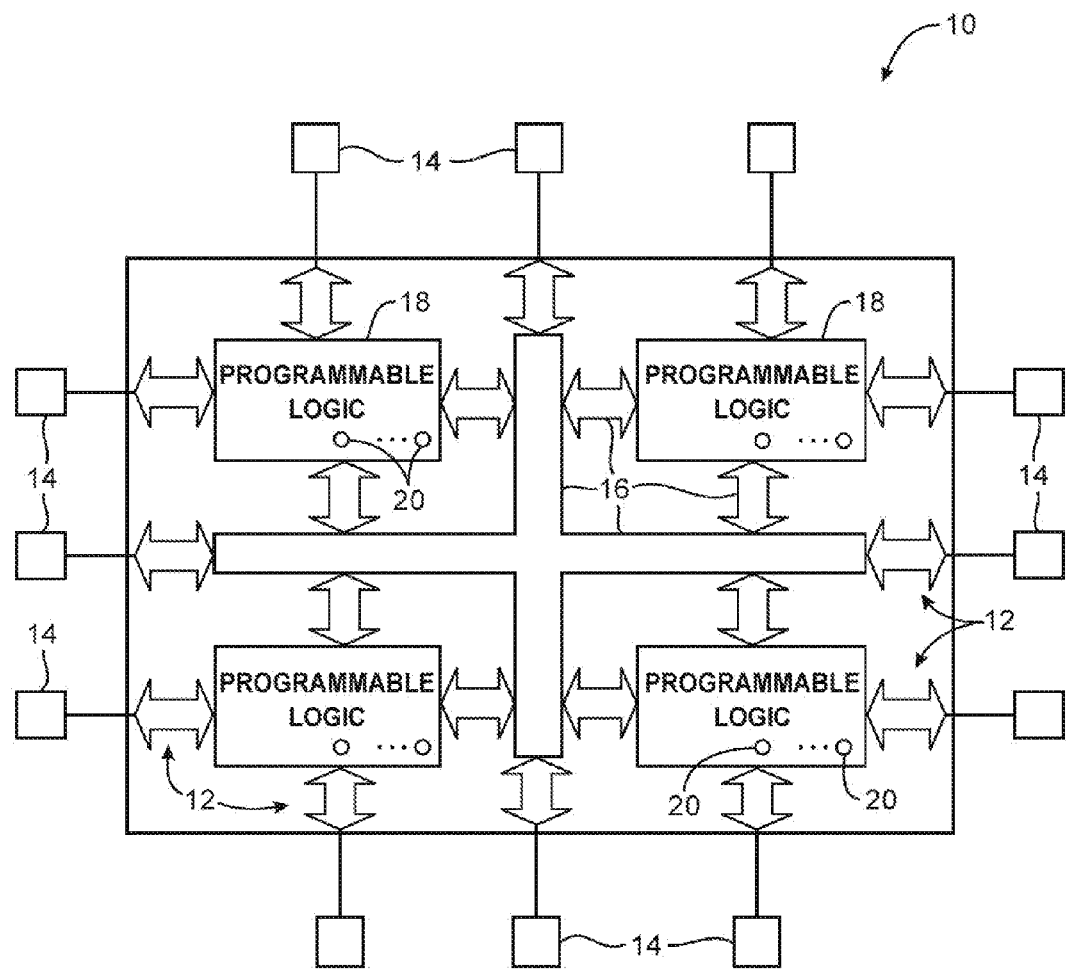
FIG. 1A is an illustrative diagram of a programmable integrated circuit with programmable logic in accordance with an embodiment of the present invention.

FIG. 1A shows a diagram of an illustrative programmable integrated circuit device. As shown in FIG. 1A, device 10 may have input-output (I/O) circuitry 12 for driving signals off of device 10 and for receiving signals from other devices via input-output pins 14. Interconnection resources 16 such as global and local vertical, horizontal, and diagonal conductive lines and buses may be used to route signals on device 10. Interconnection resources 16 include fixed interconnects (conductive lines) and programmable interconnects programmable connections between respective fixed interconnects). Interconnection resources 16 may sometimes be referred to herein as interconnects (e.g., interconnects formed from combinations of fixed interconnects and programmable interconnects).

Interconnects 16 may be used to interconnect regions of programmable logic such as programmable logic region 18. Programmable logic regions 18 may sometimes be referred to as logic array blocks or programmable circuit regions. Programmable logic regions 18, may, if desired, contain groups of smaller logic regions. These smaller logic regions, which may sometimes be referred to as logic elements, adaptive logic modules, or configurable logic block may be interconnected using local interconnection resources.

Programmable logic regions 18 may include combinational and sequential logic circuitry. For example, programmable logic regions 18 am include look-up tables, registers, adders, and multiplexers. Programmable logic regions 18 may be configured to perform a custom logic function.

Programmable logic regions 18 contain programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access memory (RAM) cells. Because the RAM cells are loaded with configuration data, they are sometimes referred to as configuration RAM cells (CRAM).

Programmable elements 20 may provide static control output signals for controlling the state of logic components in programmable logic 18. The output signals generated by elements 20 are typically applied to gates of metal-oxide-semiconductor (MOS) transistors (sometimes referred to as pass gate transistors). In some scenarios, programmable elements 20 may provide static data output signals for programmable circuitry. For example, look-up tables may include programmable elements 20 that produce static data output signals. In this scenario, control signals may configure the look-up tables to provide the static data output signals at look-up table outputs.

The circuitry of device 10 may be organized using any suitable architecture. As an example, logic 18 of programmable device 10 may be organized in a series of rows and columns of programmable logic regions, each of which may contain multiple smaller programmable logic regions. The logic resources of device 10 may be interconnected by interconnection resources 16 such as associated vertical, horizontal, and diagonal conductors. These conductors may include global conductive lines that span substantially all of device 10, fractional global lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple logic regions are interconnected to form still larger portions of logic. Other device arrangements may use logic that is not arranged in rows end columns.

Figure 1B:
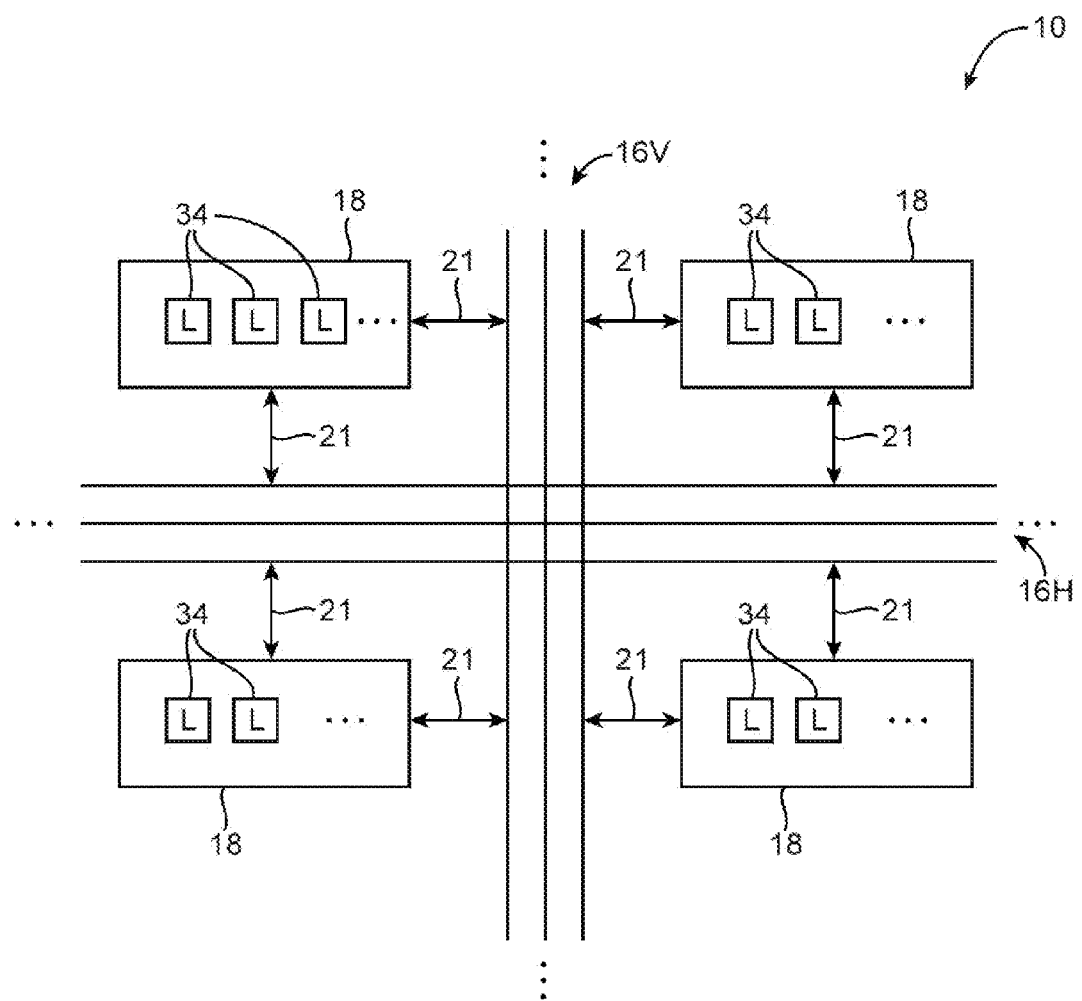
FIG. 1B is an illustrative diagram of programmable logic regions having input-output circuitry configured to drive interconnects in accordance with an embodiment of the present invention.

FIG. 1B is an illustrative diagram of programmable logic regions 18 in device 10 that may have input-output circuits 21 that can be configured to drive horizontal interconnects 16H (e.g., interconnects formed along a horizontal axis of device 10) and vertical interconnects 16V (e.g., interconnects formed along a vertical axis of device 10). Programmable logic regions 18 may include smaller programmable regions 34 (e.g., logic elements, configurable logic blocks, or adaptive logic modules) that receive input signals from interconnects 16V and 16H via input-output circuits 21 and perform custom functions on the input signals to produce output signals. The output signals produced by logic regions 34 may be provided to output circuits of input-output circuits 21. The output circuits may drive the output signals onto selected interconnects.

Input-output circuits 21 may include circuitry such as input selection circuitry for selecting input signals for programmable logic regions 18 from interconnects 16 and output selection and routing circuitry for selecting which of interconnects 16 to provide with output signals from programmable logic regions 18. The output selection and routing circuitry in input-output circuits 21 may include drivers that are used to drive interconnects with output signals.

Figure 2:
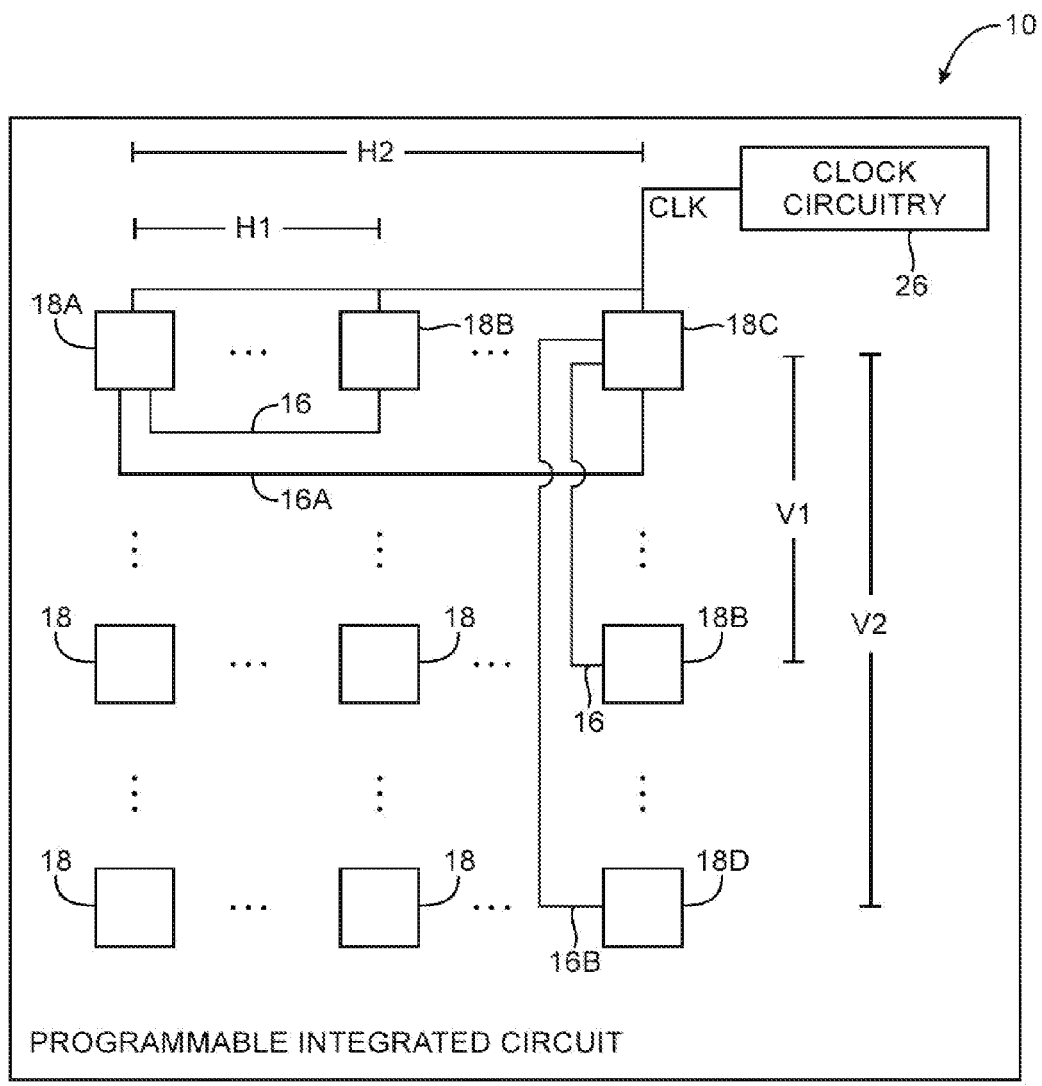
FIG. 2 is an illustrative diagram of interconnects on a programmable integrated circuit that are formed in horizontal and vertical directions with different lengths in accordance with an embodiment of the present invention.

FIG. 2 shows an illustrative arrangement of programmable logic regions 18 connected together by the interconnects 16 of FIG. 1 (e.g., global interconnects that provide routing paths across integrated circuit 10). Interconnects 16 may be formed along a horizontal axis and may therefore be referred to as horizontal interconnects (e.g., "H2"). Interconnects 16 may be formed along a vertical axis and may therefore be referred to as vertical interconnects (e.g., "V2"). Interconnects 16 may be formed along a diagonal axis across the integrated circuit (not shown) and may therefore be referred to as diagonal interconnects.

As shown in FIG. 2, horizontal interconnects and vertical interconnects may be formed with varying lengths. Horizontal interconnects 16 and 16A may have respective lengths H1 and H2 and vertical interconnects 16 and 16B may have respective lengths V1 and V2. The horizontal and vertical interconnects may provide programmable logic regions 18 with routing paths throughout device 10 (e.g., to other programmable logic regions 18). Lengths H1, H2, V1, and V2 may vary depending on the distances between Programmable logic regions 18 (e.g., length H1 may correspond to the distance between programmable logic regions 18A and 18B, whereas length H2 may correspond to the distance between programmable logic regions 18A and 18C). Each programmable logic region 18 may be independently configured to drive output signals onto the interconnects (e.g., using driver circuits within that programmable logic region 18).

Programmable integrated circuit 10 may include clock circuitry 26 that provides clock signals. The clock signals may be provided to programmable logic region 18. For example, clock circuitry 26 may provide clock signal CLK to programmable logic regions 18A, 18B, and 18C. The frequency of clock signal CLK may control the processing speed at which programmable logic regions 18A, 18B, and 18C operate (e.g., registers in the programmable logic regions may be updated every clock cycle of clock signal CLK).

In some scenarios, it may be desirable to route all output signals from a first programmable logic region together as a bus to inputs of a second programmable logic region. Consider the scenario in which programmable logic region 18A produces output signals that are to be routed together as a bus to programmable logic region 18D. In this scenario, it may be desirable to configure the output selection and routing circuitry of programmable logic region 18A such that it routes all its output signals to programmable logic region 18C over horizontal interconnects of length H2 such as horizontal interconnects 16A thereby bypassing programmable logic region 18B. It may further be desirable that the signals received by programmable logic region 18C bypass all processing steps and connect directly to the output selection and routing circuitry of programmable logic region 18C. Alternatively, it may be desirable that the programmable logic region 18C implements a register pipeline stage of the received signals. A register pipeline stage may be desirable if the signal delay associated with routing all output signals from the first programmable logic region 18A to the second programmable logic region 18D over horizontal interconnects 16A, programmable logic region 18C, and vertical interconnects 16B exceeds the maximum acceptable delay for the clock frequency of clock signal CLK (e.g., the time required for the signals to arrive at programmable logic region 18D from programmable logic region 18A may exceed the clock period of the clock frequency). In this scenario, it may be desirable that the signals received by programmable login region 18C bypass all processing steps and connect directly to the registers of logic region 18C. It may yet further be desirable that the output selection and routing circuitry of programmable logic region 18C receives signals either from the inputs of the programmable logic region over the bypass path or from the registers. Output selection and routing circuitry may further be configured to route all signals together to programmable logic region 18D over vertical interconnects of length V2 such as vertical interconnects 16B.

Figure 3:
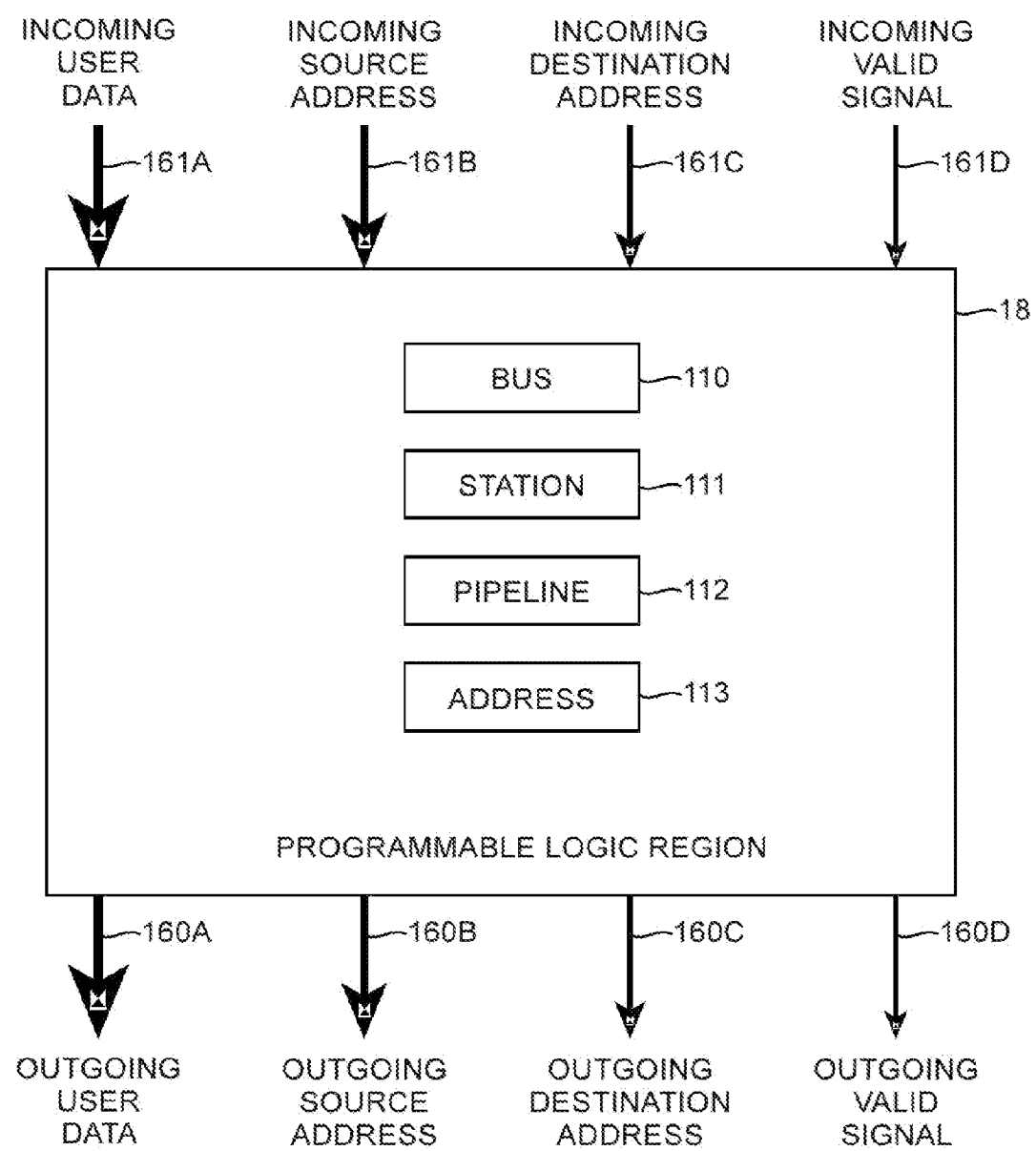
FIG. 3 is an illustrative diagram of a programmable logic region having configurable bits that enable bus interconnections in accordance with an embodiment of the present invention.

Programmable logic regions may be configured via programmable elements 20 to enable a bus interconnection. FIG. 3 is an illustrative diagram of programmable logic region 18 of FIG. 1A configured to enable a bus interconnection. Programmable elements 20 may include programmable elements that configure the programmable logic region to implement a bus (shown as 110 in FIG. 3), a data source/sink station (shown as 111 in FIG. 3), or a register pipeline stage (shown as 112 in FIG. 3). If desired, programmable elements 20 may be used to assign an address to a programmable logic region 18. All programmable logic regions 18 may include programmable elements 20 that enable the configuration of bus interconnections or only some programmable logic regions may include programmable elements for this purpose.

Programmable logic regions 18 that include programmable elements 20 enabling the configuration of bus interconnections may be configured to implement bus interconnections by loading programmable element 110 with a given value. For example, all programmable logic regions 18 that are configured to form a bus interconnection may have programmable element 110 set to an "on"state while all programmable logic regions 18 that are configured to not form a bus interconnection may have programmable element 110 set to an "off" state. Data may be routed on and off the bus interconnection at logic regions 18 current serving as data source/sink stations. A programmable logic region 18 may be configured as a source/sink station using programmable element 111. Each source/sink station on a bus interconnection may have an address. The address of a source/sink station may be stored using programmable elements 113. Programmable logic regions 18 may be configured as register pipeline stages using programmable element 112.

Programmable elements 110, 111, and 112 may be assigned different value combinations to implement a given configuration. For example, a programmable logic region 18 may be configured as a data source/sink station by loading programmable elements 111 with logic "1" and programmable elements 110 and 112 with logic "0". Programmable logic region 18 may be configured as a source/sink station by loading programmable elements 110 and 111 with logic "1" and programmable elements 112 with logic "0" or by loading programmable elements 110, 111, and 112 with logic "1". Similarly, programmable logic region 18 may be configured as a register pipeline stage by loading programmable elements 110 and 112 with "1"and 111 with logic "0" or by loading only programmable elements 112 with logic "1" and loading programmable elements 110 and 111 with logic "0". Programmable elements 113 may be assigned different value combinations to implement an address associated with a programmable logic region 18 configured as a source/sink station. Source/sink stations in a same bus interconnection are required to have unique addresses. Source/sink stations in different bus interconnections may have the same address. One of ordinary skill in the art will recognize that the examples of value combinations described are merely illustrative, and that other specific value combinations may be utilized.

Signals may be sent over a bus interconnection using interconnection resources 16 (see, e.g., FIG. 1A). Bus interconnections may require specific information to be sent together with user data. For example, a destination address may be transmitted with the user data to identify the source/sink station for which the user data is destined. In this scenario, the different interconnection resources 16 maybe assigned to route signals having a given purpose as shown in FIG. 3. For example, a given number of bits of interconnection resources 16 may be reserved for the incoming user data 161A and for the outgoing user data 160A. A given number of bits may be reserved for the incoming destination address 161C and the outgoing destination address 160C. Other information may be transmitted on the bus interconnection as well. For example, some bits may be reserved to designate the source/sink station that sent the data (e.g., incoming source address 161B and outgoing source address 160B). Other bits may be reserved for a signal indicating the validity of the transmitted user data (e.g., incoming valid signal 161D and outgoing valid signal 160D). Other information may be part of the signal sent over the bus interconnection as well, such as a signal indicating the availability of the bus, checksum values generated by a cyclic redundancy check or parity bits to name a few.

Programmable logic regions 18 may be configured to form bus interconnections. FIGS. 4A, 4B, 4C, and 4D are illustrative diagrams showing different configurations of programmable logic regions 18A, 18B, 18C, and 18D in accordance with embodiments of the present invention. Programmable logic regions and 18A, 18B, 18C, and 18D may include, bypass circuitry 38. Bypass circuitry 38 may sometimes be referred to as selection bypass circuitry. Programmable logic regions 18A, 18B, 18C, and 18D may each include one or more smaller programmable logic regions 34 that can be configured to perform custom user functions (e.g., programmable logic elements, configurable logic blocks, or adaptive logic modules). As an example, programmable logic region 18A may include a single logic element 34, two logic elements 34, four logic elements 34, or more.

Programmable logic regions 18A, 18B, 18C, and 18D may each include input selection circuitry 54. If desired, input selection circuitry 54 may select which interconnects are coupled to programmable logic regions 34 (e.g., which of interconnects 16 of FIG. 2). For example, circuitry 54 may include input selection circuitry for selecting which interconnects are used to provide input signals to programmable logic regions 34. Programmable logic regions 34 may receive the input signals and perform custom user functions to produce output signals. Output selection and routing circuitry 56 may include circuitry for selecting which interconnects are used to route the output signals from programmable logic regions 34 to other programmable logic regions of integrated circuit 10. Input selection circuitry 54 and output selection and routing circuitry 56 may include circuitry such as multiplexers that can be configured via corresponding programmable elements (not shown). Input selection circuitry 54 and output selection and routing circuitry 56 may be formed as part of input-output circuits such as input output circuits 21 of FIG. 1B.

Programmable logic regions 34 may each include two or more registers such as registers 40A and 40B. If desired, registers 40A and 40B may store output data generated by the programmable logic regions. In this scenario, the output data stored in registers 40A and 40B may be routed throughout programmable integrated circuit 10 using interconnects such as interconnection resources 16.

Figure 4A:
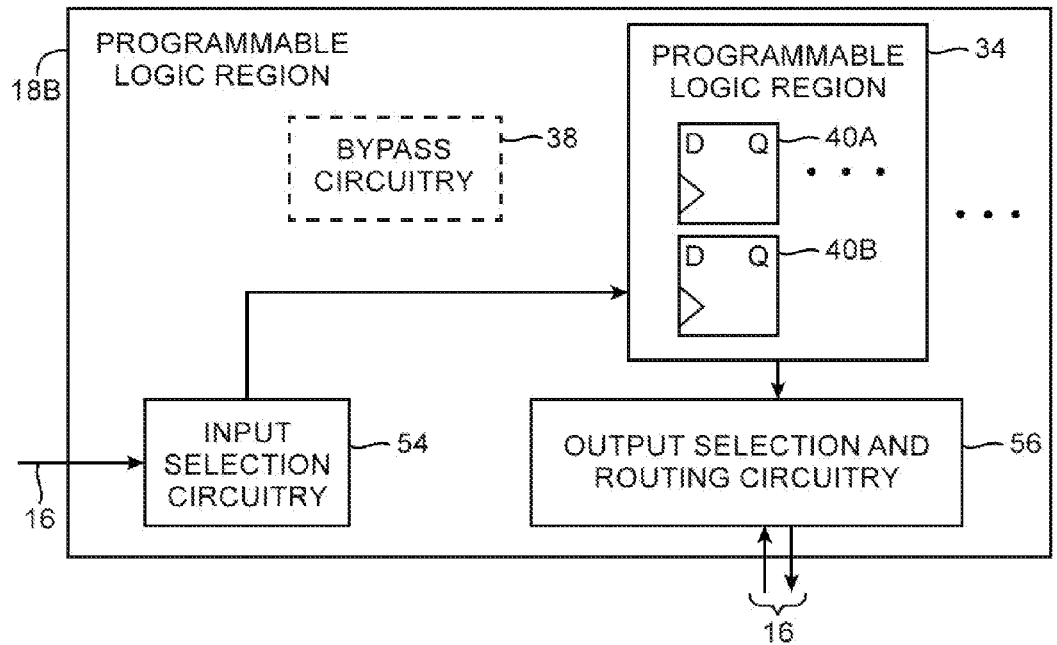
FIG. 4A is an illustrative diagram of a programmable logic region being configured to disable the bus interconnections in accordance with an embodiment of the present invention.

Programmable logic region 18B in FIG. 4A may be configured so that the programmable logic region doesn't form a bus interconnection. In this configuration, input selection circuitry 54 may select which of the interconnection resources 16 are routed to programmable logic region 34. Programmable logic region 34 may produce output signals by processing the signals signals received over selected interconnection resources. The output signals may be stored in registers 40A and 40B and sent to output selection and routing circuitry 56. Output selection and routing circuitry 56 may receive the output signals of programmable logic region 34 and selected signals may drive selected interconnection resources 16.

Figure 4B:
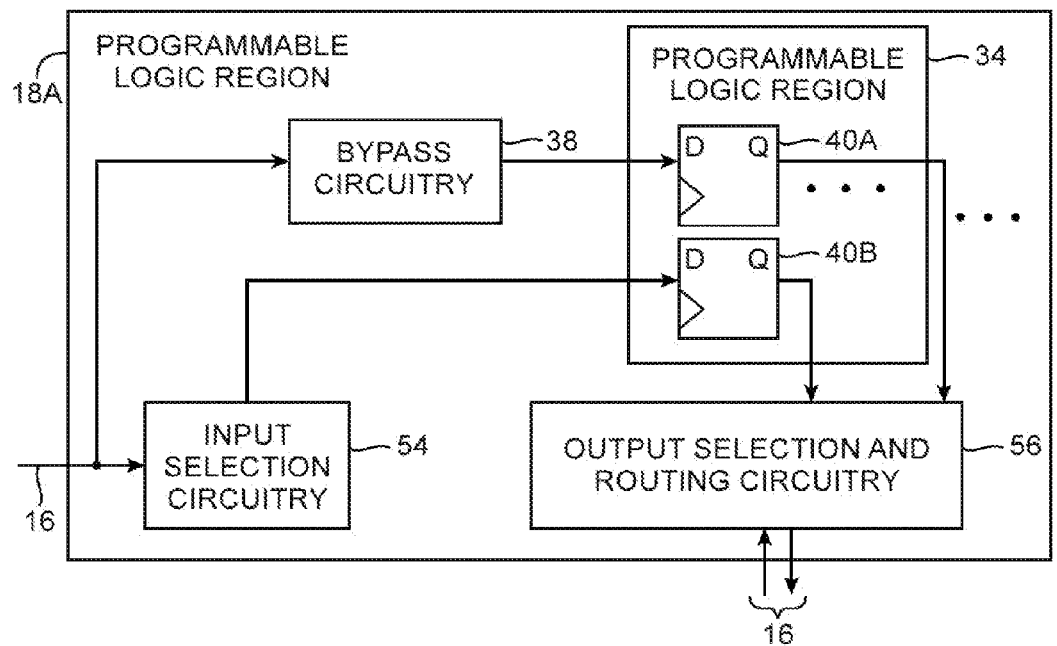
FIG. 4B is an illustrative diagram of a programmable logic region being configured as a data source/sink station in the bus interconnection in accordance with an embodiment of the present invention.
Figure 4C:
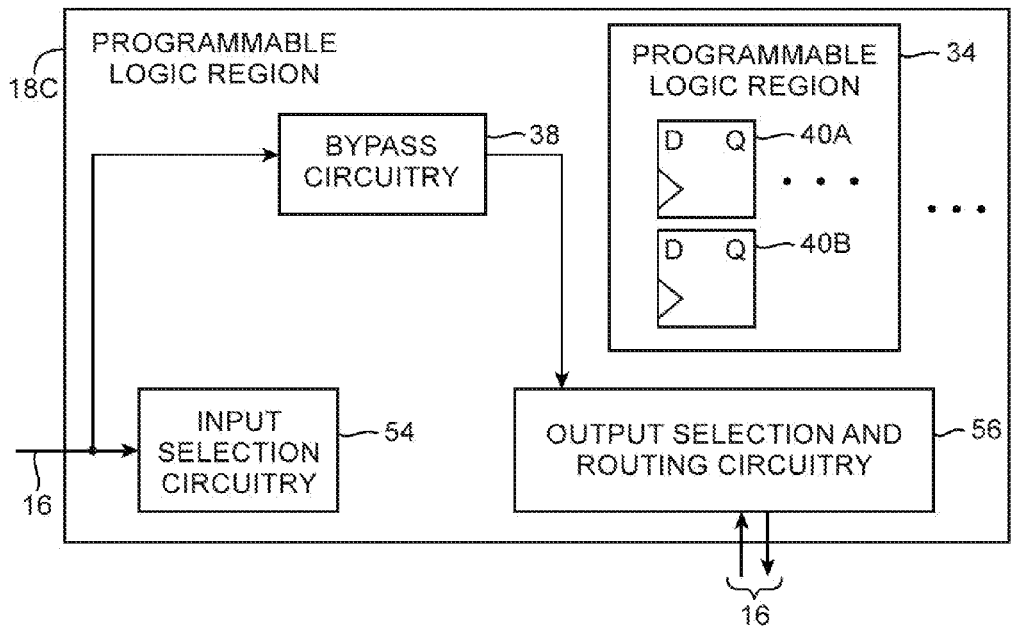
FIG. 4C is an illustrative diagram of a programmable logic region being configured as an interconnect stitching stage in the bus interconnection in accordance with an embodiment of the present invention.
Figure 4D:
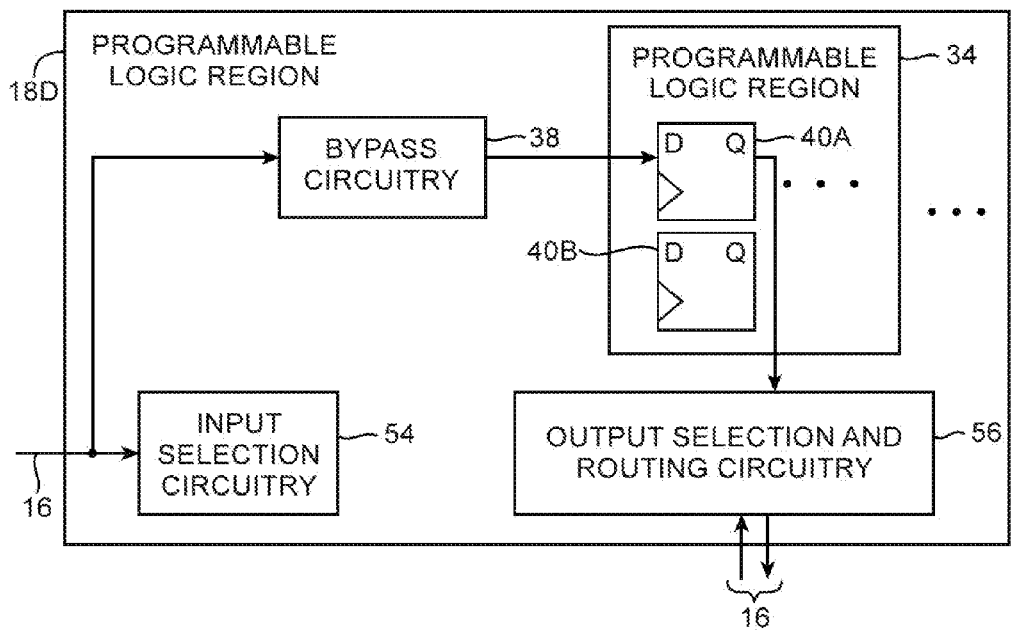
FIG. 4D is an illustrative diagram of a programmable logic region being configured as a register pipeline stage in the bus interconnection in accordance with an embodiment of the present invention.

Programmable logic regions 18A of FIG. 4B, 18C of FIG. 4C, and 18D of FIG. 4D may be configured to form a bus interconnection. In a bus interconnection, all output signals from a first programmable logic region may be routed together as a bus to inputs of a second programmable logic region. For this purpose, all output signals from the first programmable logic region may use the same interconnection resources and pass through the same intermediate programmable logic regions until reaching the second programmable logic region. To implement a bus interconnection, output selection and routing circuitry 56 may be configured to select the bus interconnection out of interconnection resources 16 over which the signal is transmitted. A bus interconnection may take any form or shape on an integrated circuit. The bus interconnection may be a uni-directional bus interconnection or it may be a bi-directional bus interconnection. A bus interconnection may have an arbitrary number of programmable logic regions 18 configured as source/sink stations, as register pipeline stages, or for wire stitching limited only by the number of programmable logic regions configured to form a given bus interconnection.

Bypass circuitry 38 may circumvent input selection circuitry 54. For example, programmable logic region 18A in FIG. 4B may be configured to implement a source/sink station. In this scenario, bypass circuitry 38 may route signals received over interconnection resources 16 directly to register 40A in programmable logic region 34. The data transmitted over the bus interconnection may be stored in registers 40A for further processing if the address of the current source/sink station matches the destination address that is included in the transmitted data. In this case, new output data may be generated by programmable logic region 34 based on signals that the programmable logic region receives over selected interconnection resources 16 from input selection circuitry 54. The output data may be transmitted as new data over a bus interconnection selected from interconnection resources 16 by the output selection and routing circuitry 56.

Programmable logic regions 18C in FIG. 4C that are configured as an interconnection stitching stage may use the bypass circuitry 38 to bypass input selection circuitry 54 and programmable logic region 34 by routing signals received over interconnection resources 16 directly to output selection and renting circuitry. The output selection and routing circuitry 56 may be configured to select the bus interconnection from the interconnection resources 16 over which the signal may be transmitted.

FIG. 4D shows a programmable logic region 18D configured as a registered pipeline stage. In order to satisfy timing constraints associated with the clock frequency of clock signal CLK, signals received over interconnection resources 16 may be routed through bypass circuitry 38 directly to register 4OA of programmable logic region 18D. This configuration bypasses the input selection circuitry 54 and circuitry that may be configured to perform custom user functions (e.g., programmable logic elements, configurable logic blocks, or adaptive logic modules) in programmable logic region 34. The output signals of registers 40A are sent to output selection and routing circuitry 56, which is configured to select the bus interconnection from interconnection resource 16 over which the signal may be transmitted. To satisfy critical path delay constraints associated with the clock frequency of clock signal CLK, programmable logic region may be configured to implement register pipeline stages 18D which may be placed at appropriate distances on the bus interconnection. For example, a bus signal sent by a programmable logic region 18A to another programmable logic region 18A may pass through a programmable logic region configured to implement a register pipeline stage 18D after passing through a programmable logic region configured to stitch wires 18C.

Figure 5:
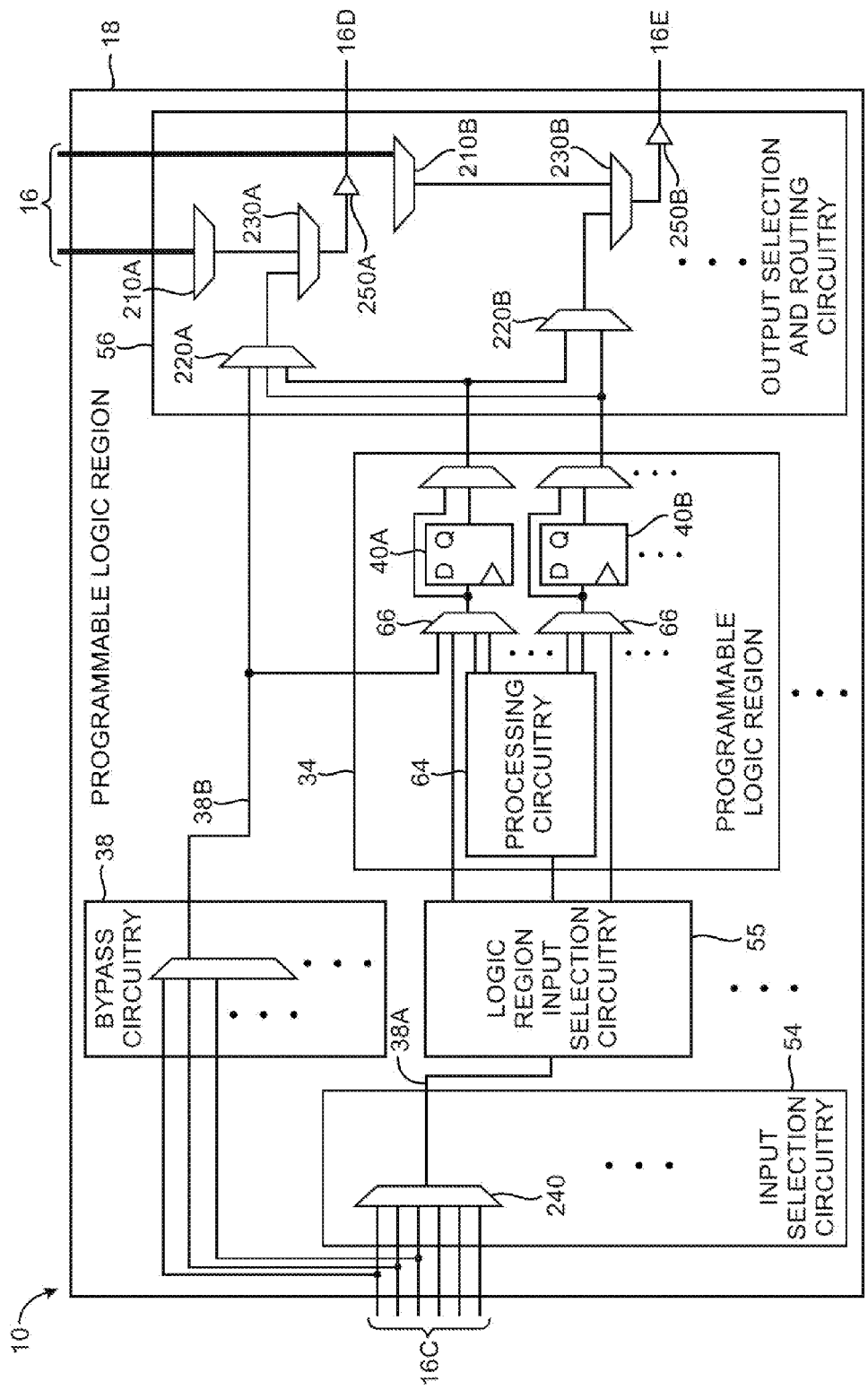
FIG. 5 is an illustrative diagram of a programmable logic region having input selection circuitry, logic region input selection circuitry, and output selection and routing circuitry in accordance with an embodiment of the present invention.

A programmable logic region 18 having bypass circuitry 38 to select which interconnection resources 16C may be routed using bypass paths 38B is shown in FIG. 5. Programmable logic region 18 may include programmable logic region 34, input selection circuitry 54, logic region input selection circuitry 55, and output selection and routing circuitry 56. Programmable logic region 18 may include programmable elements 110, 111, 112, and 113 configured to enable a bus interconnection as shown in FIG. 3. For example, programmable logic region 18 may include programmable elements that configure the programmable logic region as forming a bus (shown as 111 in FIG. 3), as implementing a source/sink station (shown as 111 in FIG. 3), or as implementing a register pipeline stage (shown as 112 in FIG. 3). Programmable logic region 18 may be configured as an interconnect stitching stage when forming a bus interconnection, to implement a register pipeline stage in a bus interconnection, or to implement a source/sink station for receiving and transmitting data over a bus interconnection by loading programmable elements 110, 111, 112 appropriately.

Programmable logic region 18 may include inputs coupled to interconnection resources 16C and outputs coupled to interconnection resources 16D and 16E. Interconnection resources 16C, 16D, and 16E may serve as global and local interconnects (e.g., interconnects for routing signals globally throughout device 10 or interconnects for routing signals to neighboring programmable logic regions). Interconnection resources 16, 16C, 16D, and 16E include vertical, horizontal, and/or diagonal conductive lines of different lengths. Interconnection resources 16 may include fixed interconnects (conductive lines) and programmable interconnects (i.e., programmable connections between respective fixed interconnects). Additional interconnection resources 16 that are coupled to multiplexers 210A and 210B may include any desired interconnection resources. Interconnection resources 16 may include some or all of interconnection resources 16C, 16D, or 16E, or may include additional interconnection resources (e.g., additional interconnection resources of different types or to different locations on integrated circuit 10).

The example of FIG. 5 which shows programmable logic region 18 coupled to interconnects 16, 16C, 16D, and 16E is merely illustrative. If desired, programmable logic region 18 may be coupled to any number of interconnects configured to route input signals to programmable logic region 18 and to route output signals away from programmable logic region 18. For example, programmable logic region 18 may be coupled to interconnects formed along different axes and having different lengths. Programmable logic region 18 may be coupled to tens or hundreds of interconnects (as an example).

The outputs of programmable logic region 18 may he driven with output signals selected by output selection and routing circuitry 56. For example, output selection and routing circuitry 56 may drive interconnection resources 16D with output signals from programmable logic regions 34.

Output selection and routing circuitry 56 may include multiplexers 210A, 210B, 220A, 220B, 230A, 230B, and drivers 250A and 250B. Each driver (e.g., drivers 250A and 250B) may drive an interconnection resource such as 16D or 16E with a signal selected by the multiplexers. If desired, drivers 250A and 250B may be configured via programmable elements 20 to electrically disconnect some or all of the interconnects.

Programmable logic region 18 may be configured to be outside a bus interconnection similar to programmable logic region 18B in FIG. 4A. In this scenario, input selection circuitry 54 may select input signals received over interconnection resources 16C for transmission on input path 38A. Logic region input select circuitry 55 may further select signals among the signals received over input path 38A and send those signals to the inputs of programmable logic region 34. Programmable login region 34 may process the received signals in processing circuitry 64. Processing circuitry 64 may include look-up table circuitry, adder circuitry, multiplier circuitry, or any other logic circuitry that processes the received signals and produces output signals. Multiplexers 66 may receive those output signals as well as signals directly from the logic region input selection circuitry 55 which bypass the processing circuitry 64. Each multiplexers 66 may select and propagate a signal from its input signals. Those signals may be either latched using registers 40A and 40B or they may be routed directly to the output selection and routing circuitry 56. Multiplexors 220A and 220B together with multiplexers 230A and 230B in the output selection and routing circuitry 56 may select which output of programmable logic region 34 may be transmitted using interconnection resource 16D and which may be transmitted using interconnection resource 16E. Alternatively, the output selection and routing circuitry 56 may be configured to route a signal received over interconnection resources 16 to interconnection resources 16D or 16E. In this case, multiplexer 210A and 230A or 210B and 230B may be configured accordingly.

Programmable logic region 18 of FIG. 5 may be configured as an interconnection stitching stage which may be used to stitch interconnection resources together to form a bus interconnection. For example, loading programmable elements 110 with logic "1" may indicate that the programmable logic region 18 is forming a bus interconnection. Loading programmable elements 111 and 112 in FIG. 3 with logic "0" may indicate that the programmable logic region 18 is neither forming a register pipeline stage nor a source/sink station. In this configuration, the data arriving over the bus interconnection at programmable logic region 18 may be selected by bypass circuitry 38 for routing ever bypass path 38B directly to multiplexer 220A in output selection and routing circuitry 56 and from there to multiplexer 230A and driver 250A and over interconnection resources 16D to the next programmable logic region via the bus interconnection.

Programmable logic region 18 of FIG. 5 may be configured to form a register pipeline stage in the bus interconnection for example by loading programmable logic elements 110 and 112 with logic "1" and loading programmable elements 111 with logic "0" in FIG. 3. In this scenario, the data received over the bus interconnection may be routed through bypass circuitry 38, over bypass path 38B, through multiplexer 66 to register 40A. From there, the data may be routed directly to multiplexers 220A in the output selection and routing circuitry 56 from where it may be routed to multiplexer 230A and driver 250A and transmitted over interconnection resources 16D to the next programmable logic region via the bus interconnection.

Programmable logic region 18 of FIG. 5 may further be configured as a source/sink station along a bus interconnection that receives data transmitted over the bus interconnection and transmits new data over the bus interconnection (e.g., the source/sink station is endpoint for received information and startpoint for generated information). Programmable logic region 18 may, for example, be configured as a source/sink station by loading programmable elements 110 and 111 with logic "1" and further assigning an address to programmable logic region 18 by loading programmable elements 113 in FIG. 3. In this scenario, a comparator may compare the address of the programmable logic region stored in programmable elements 113 of FIG. 3 with the destination address received together with the data over the bus interconnection. The programmable logic region may be configured to serve as a register pipeline stage as described above if the addresses don't match. When the addresses match, the programmable logic region may be configured such that the data received over the bus interconnection is routed through bypass circuitry 38, over bypass path 38B, through multiplexer 66, and to register 40A where the data is stored. For further processing, the data may he routed to another programmable logic region over multiplexers 220B, 230B, driver 250B, and interconnection resource 16E.

Programmable logic region 18 may receive signals over interconnection resources 16C that are not part of the signals transmitted over the bus interconnection. Some of those signals may be selected by the input selection circuitry 54 for transmission on input path 38A. Logic region input select circuitry 55 may further select signals among the signals received over input path 38A and send those signals to the inputs of programmable logic region 34. Programmable logic region 34 may process the received signals in processing circuitry 64. Processing circuitry 64 may include look-up table circuitry, adder circuitry, multiplier circuitry, or any other logic circuitry that processes the received signals and produces output signals. Multiplexers 66 may receive those output signals as well as signals directly from the logic region input selection circuitry 55 which bypass the processing circuitry 64. Each multiplexer 66 may select and propagate a signal from one of its input signals. Upper multiplexer 66 selects the signal from bypass path 38B for storage in register 40A as mentioned above. The signals received and selected by the lower multiplexer 66 may either be latched using registers 40B or they may be routed directly to the output selection and routing circuitry 56. Multiplexers 220A together with multiplexers 230A in the output selection routing circuitry 56 may be select which output of programmable logic region 34 may be transmitted using interconnection resource 16D.

Figure 6:
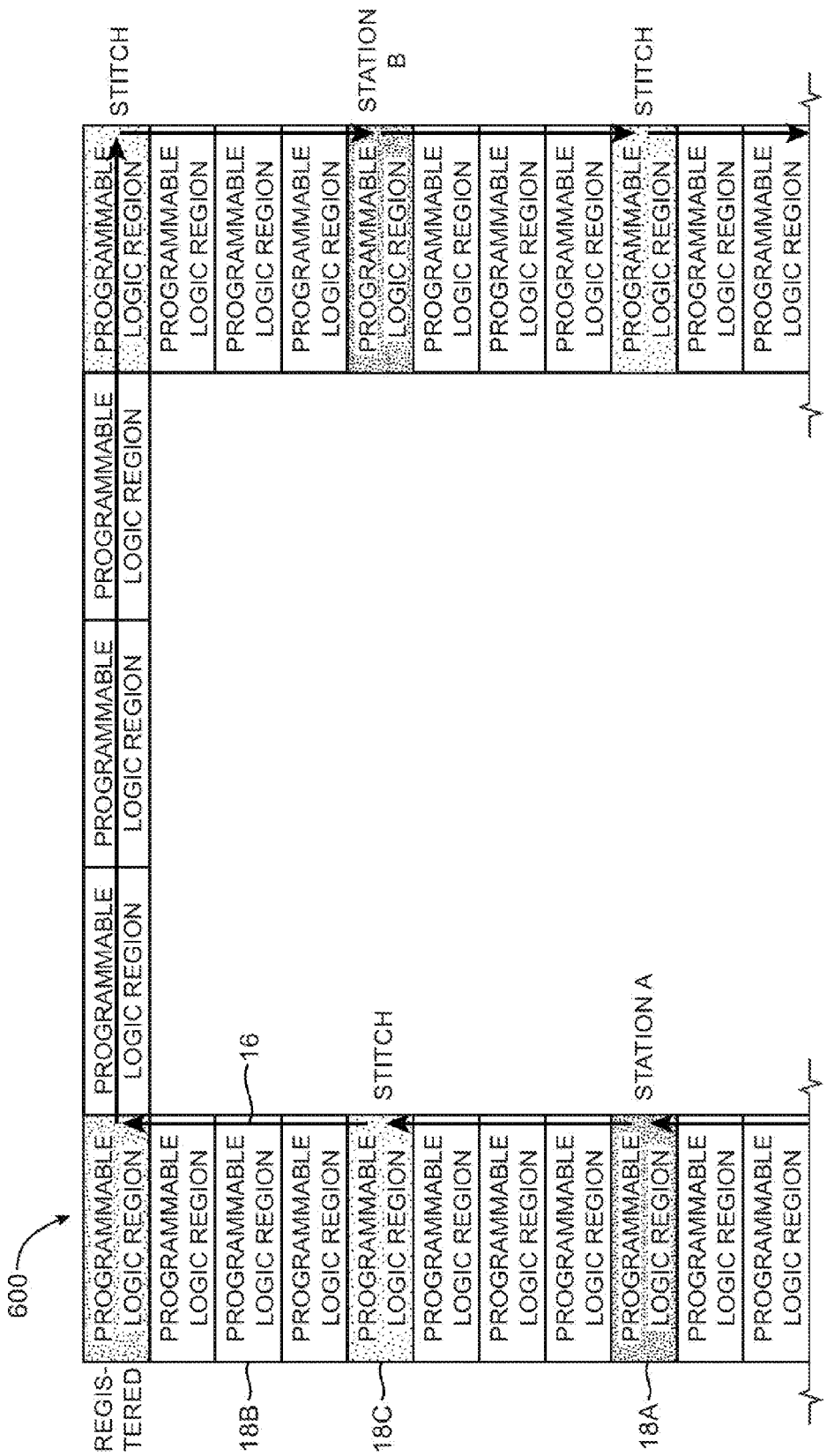
FIG. 6 is an illustrative diagram of an integrated circuit having programmable logic regions configured to implement a ring bus interconnection in accordance with an embodiment of the present invention.

FIG. 6 shows an illustrative diagram of an integrated circuit having programmable logic regions configured to implement a ring-shaped bus interconnection 600. For example, bus interconnection 600 connected in a ring may have 6 programmable logic regions configured as source/sink stations (e.g., 18A), 4 programmable logic regions configured as register pipeline stages (e.g., 18D), and 8 programmable logic regions configured for wire stitching. All other programmable logic regions (e.g., 18C) may be configured to not participate in forming a bus interconnection. Each programmable logic region configured as a source/sink station 18A may have an address stored in programmable elements 113 of FIG. 3. As an example, the six programmable logic regions configured as source/sink stations 18A in the ring bus interconnection 600 may have addresses encoded in three bits of data ranging from "000" to "101."

Each programmable logic region 18 that forms the ring bus interconnection 600 may choose a different subset of interconnection resources 16D of FIG. 5 out of the available interconnection resources 16 at the respective programmable logic region for forming the ring bus interconnection. For example, all programmable logic regions in the left column of 600 except the top left corner that is configured as a register pipeline stage may choose upgoing vertical interconnects of length four as shown in FIG. 6. All programmable logic regions in the right column of 600 except the bottom right programmable logic region that is configured as a register pipeline stage may choose downgoing vertical interconnects of length four as shown in FIG. 6. The programmable logic region in the top left corner that is configured as a register pipeline stage may choose horizontal interconnects of length four to the right and the programmable logic region. in the bottom right corner that is configured as a register. pipeline stage may choose horizontal interconnects of length four to the left thus forming a ring bus interconnection.

In the configuration of FIG. 6, several programmable logic regions configured as source/sink stations may send data over the ring bus interconnection at the same time as long as distinctive interconnection resources are used. For example, source/sink station A may be sending data to source/sink station C while source/sink station D may be sending data to source/sink station E and while source/sink station F may be sending data to source/sink station F. However, source/sink station B may not send data to source/sink station D at the same time as source/sink station A is sending data to source/sink station C because the interconnection resources between source/sink station B and source/sink station C would be used by both data transmissions at the same time.

Such a scenario which is sometimes referred to as a conflict on a bus may be prevented in several ways. For example, the data transmitted over ring bus interconnection 600 may have a source address associated with the source/sink station that is sending the data and a destination address associated with the source/sink station that is the recipient of the data as shown in FIG. 3. A source/sink station may check its position and not transmit new data over the ring bus interconnection if the source/sink station's position lies between the source and destination source/sink station. Alternatively, the data transmitted over ring bus interconnection 600 may include a status signal indicating whether the ring bus interconnection is in use. For example, the data may include a valid signal as shown in FIG. 3. A source/sink station may only send new data over the ring bus interconnection if the valid signal has a given value that indicates that the ring bus interconnection is currently not in use (e.g., the valid signal may be set to a logic "0"). When sending new data over the ring bus interconnection, the valid signal may be set to a value that indicates that the ring bus interconnection is now used (e.g., the valid signal may be set to a logic "1") and only the source/sink station that is the destination of the data may reset the valid signal to a value that indicates that the ring bus interconnection is no longer in use.

Figure 7:
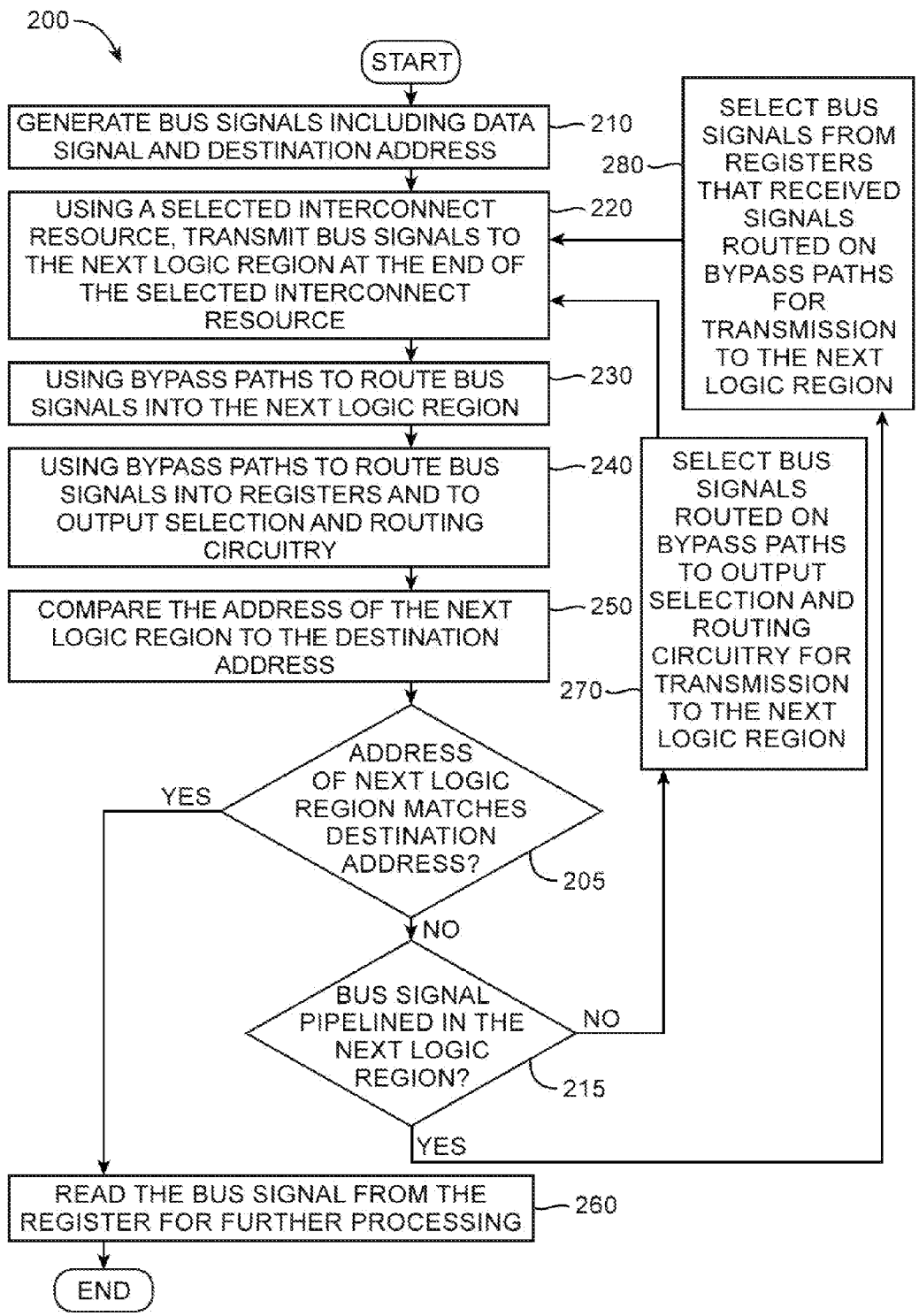
FIG. 7 is a flow chart of illustrative steps for implementing bus interconnections in an integrated circuit using configurable interconnect in accordance with an embodiment of the present invention.

FIG. 7 shows a flow chart 200 of illustrative steps for implementing bus interconnections in an integrated circuit using configurable interconnects. At step 210, a programmable region configured as a source/sink station such as for example programmable logic region 18A in FIG. 6 may generate bus signals for transmission over a bus interconnection. Those bus signals may include user data and a destination address associated with a programmable logic region configured as a source/sink station that is the recipient of the user data transmitted over the bus interconnection. The bus signal may include other information as well. For example, the bus signal may include the address of the source/sink station that is transmitting the bus signal. The bus signal may include other information as well such as for example status information indicating whether the bus interconnection is currently used, parity bits, or checksum values for error checking of the transmitted data to name a few.

At step 220, the source/sink station may then select interconnection resources over which to transmit the bus signal to the next programmable login region. The bus signal may use any available interconnection resource in the integrated circuit. For example, the bus signal may use vertical interconnects. The bus signal may use interconnection resources in other directions as well. For example, the bus signal may use a horizontal direction or a diagonal direction. The bus signal may use interconnections in either direction such as up, down, to the left, or to the right. The bus signal may use interconnects of different length V1, V2, H1, H2, D1, D2, etc., or any other length of interconnects in the integrated circuit.

At step 230, the bus signal may use bypass paths to enter the next programmable logic region. From there, at step 240, the bus signal may be routed into registers and to the output selection and routing circuitry of the programmable logic region. The next step 250 may compare the address of the programmable logic region to the destination address in the bus signal. Alternatively, the addresses may only be compared if the programmable logic region is configured as a source/sink station. If, at step 205, the address of the programmable logic region matches the destination address in the bus signal, then, at step 260, the bus signal may be stored in the registers and read from there for further processing. If, at step 205, the address of the programmable logic region does not match the destination address in the bus signal, the next step 215 may check whether the programmable logic region is configured as a register pipeline stage. If yes, the bus signal is stored in the registers at step 280, and, at step 220, the output selection and routing circuitry may be configured to select those signals for transmission as a bus signal over selected interconnection resources to the next programmable logic region. If, at step 215, the programmable logic region is not configured as a register pipeline stage, then, at step 270, the bus signal is directly routed on bypass paths to the output selection and routing circuitry which may be configured to select those signals for transmission as a bus signal over selected interconnection resources to the next programmable logic region at step 220.

The method and apparatus described herein may be incorporated into any suitable electronic device or system of electronic devices. For example, the method and apparatus may be incorporated into numerous types of devices such as microprocessors or other ICs. Exemplary ICSs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of being programmable or re-programmable logic is desirable. The programmable logic device can be used to perform a variety of different logic functions. For example, the programmable logic device can configured as a processor or controller that works in cooperation with a system processor. The programmable logic device may be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. An integrated circuit, comprising:
a plurality of logic regions, wherein each logic region in the plurality of logic regions includes bypass circuitry for bypassing at least some routing and processing circuitry in that logic region, and wherein a selected portion of the plurality of logic regions implements a bus connection; and
conductive paths interconnecting the selected portion of the plurality of regions, wherein the bypass circuitry in each logic region in the selected portion is activated, and wherein the bypass circuitry in logics other than the selected portion is deactivated.

2. The integrated circuit defined in claim 1, wherein at least some logic region in the selected portion is operable as a source-sink station logic region, and wherein each source-sink station logic region in the plurality of logic regions generates data and associated address information for transmission to a destination logic region in the plurality of logic regions.

3. The integrated circuit defined in claim 1, wherein at least some logic region in the selected portion is operable as a register pipeline stage logic region, and wherein each register pipeline stage logic region in the plurality of logic regions receives incoming data and stores the incoming data in a register in that register pipeline stage logic region to implement pipelining.

4. The integrated circuit defined in claim 3, wherein at least some logic region in the selected portion is operable as a stitching stage logic region, and wherein each stitching stage logic region in the plurality of logic regions receives incoming data and passes the incoming data to a subsequent logic region in the plurality of logic region without storing the incoming data in the register.

5. The integrated circuit defined in claim 1, wherein each logic region in the plurality of logic regions comprises:
input selection circuitry that receives signals from another logic region in the plurality of logic regions via a respective portion of the conductive paths; and
a logic sub-region that receives signals from the input selection circuitry in that logic region, wherein the bypass circuitry in that logic region bypasses the input selection circuitry in that logic region by selectively routing signals from the respective portion of the conductive paths to the logic sub-region in that logic region.

6. The integrated circuit defined in claim 1, wherein each logic region in the plurality of logic regions comprises:
a logic sub-region that receives signals from a respective portion of the conductive paths; and
output selection and routing circuitry that receives output signals from the logic sub-region in that logic region, wherein the bypass circuitry in that logic region bypasses the logic sub-region in that logic region by selectively routing signals from the respective portion of the conductive paths to the output selection and routing circuitry in that logic region.

7. The integrated circuit defined in claim 1, wherein the plurality of logic regions is coupled in a ring.

8. A method of operating an integrated circuit having a plurality of logic regions, comprising:
with a source-sink station logic region in the plurality of logic regions, generating data and associated address information for transmission to a destination logic region in the plurality of logic regions;
with a stitching stage logic region in the plurality of logic regions, receiving the data from the source-sink station logic region and passing the data to a subsequent logic region in the plurality of logic regions; and
with a register pipeline stage logic region in the plurality of logic regions, receiving the data from the source-sink station logic region and storing the data in a register to implement pipelining.

9. The method defined in claim 8, wherein each logic region in the plurality of logic regions includes input selection circuitry, output selection and routing circuitry, and a logic sub-region that outputs signals to the output selection and routing circuitry.

10. The method defined in claim 9, wherein each logic region in the plurality of logic regions further includes bypass circuitry coupled to a selected one of the logic sub-region and the output selection and routing circuitry in that logic region.

11. The method defined in claim 10, wherein passing the data to the subsequent logic region with the stitching stage logic region comprises using the bypass circuitry to bypass the input selection circuitry in that stitching stage logic region.

12. The method defined in claim 10, wherein passing the data to the subsequent logic region with the stitching stage logic region comprises using the bypass circuitry to bypass the logic sub-region that stitching stage logic region.

13. The method defined in claim 10, further comprising:
with the register pipeline stage logic bypassing the input selection circuitry by routing the received data directly to the logic sub-region in that register pipeline stage logic region.

14. The method defined in claim 8, further comprising:
with a selected logic region in the plurality of logic regions, receiving the transmitted data from the source-sink station logic region; and
comparing an address of the selected logic region to the address information associated with the destination logic region.

15. An integrated circuit, comprising:
a logic region having inputs;
interconnects that route signals on the integrated circuit;
input selection circuitry coupled between the interconnects and the logic region; and
bypass circuitry that bypasses the input selection circuitry by selectively routing the signals on the interconnects to the inputs of the logic region.

16. The integrate circuit in defined in claim 15, further comprising:
output selection and routing circuitry that receives output signals from the logic region, wherein the bypass circuitry bypasses the logic region by selectively routing the signals on the interconnects directly to the output selection and routing circuitry.

17. The integrated circuit defined in claim 15, wherein the logic region includes a register for pipelining signals received via the interconnects.

18. The integrated circuit defined in claim 17, wherein the logic region further includes processing circuitry that receives the signals from the interconnects and that generates corresponding output signals.

19. The integrated circuit defined in claim 18, wherein the logic region further includes a multiplexing circuit coupled between the processing circuitry and the register.

20. The integrated circuit defined in claim 19, wherein the circuit has a first input that is coupled to the bypass circuitry, a second input that is coupled to the process circuitry, and an output that is coupled to the register.

* * * * *